United States Patent [19]

Brown et al.

[11] Patent Number: 4,632,485
[45] Date of Patent: Dec. 30, 1986

[54] ELECTRICAL CIRCUIT TESTING APPARATUS

[76] Inventors: Kenneth C. Brown, 2137 W. Peralta; Carl E. Wheeler, 644 S. San Jose, both of Mesa, Ariz. 85202

[21] Appl. No.: 741,938
[22] Filed: Jun. 6, 1985
[51] Int. Cl.⁴ .......................................... H01R 13/639
[52] U.S. Cl. .................... 339/75 M; 29/842; 339/17 CF; 339/91 R; 339/255 R
[58] Field of Search ............... 324/158 F; 339/255 R, 339/17 CF, 91 R, 75 M, 75 MP, 842

[56] References Cited

U.S. PATENT DOCUMENTS

| | | | |
|---|---|---|---|
| 2,742,626 | 4/1956 | Collins et al. | 339/255 R |
| 3,363,220 | 1/1968 | Redd et al. | 339/255 R |
| 4,012,097 | 3/1977 | Long et al. | 324/158 F |
| 4,060,296 | 11/1977 | Kunkle et al. | 339/17 CF |
| 4,179,171 | 12/1979 | Shannon | 339/255 R |
| 4,241,966 | 12/1980 | Gomez | 339/45 M |
| 4,298,239 | 11/1981 | Montalto et al. | 339/66 M |
| 4,357,062 | 11/1982 | Everett | 339/18 R |
| 4,358,175 | 11/1982 | Reid | 339/75 M |
| 4,508,403 | 4/1985 | Weltman et al. | 339/17 CF |
| 4,541,676 | 9/1985 | Hansen et al. | 339/17 CF |

OTHER PUBLICATIONS

"Trends in Probe Applications"; Glau, Gordon; Circuits Manufacturing; Aug. 1981.
Everett/Charles Catalog, 1982.

Primary Examiner—John McQuade

[57] ABSTRACT

A connector apparatus which is useful in testing electrical circuits where it is desired to mate test equipment to conventional integrated circuit sockets is disclosed. Spring probes make electrical contact with integrated circuit socket pins. J-shaped members of the apparatus have fingers which engage conventional integrated circuit sockets between the socket and a circuit board to clamp the apparatus to the socket. Fasteners lock the apparatus in this clamped position.

7 Claims, 6 Drawing Figures

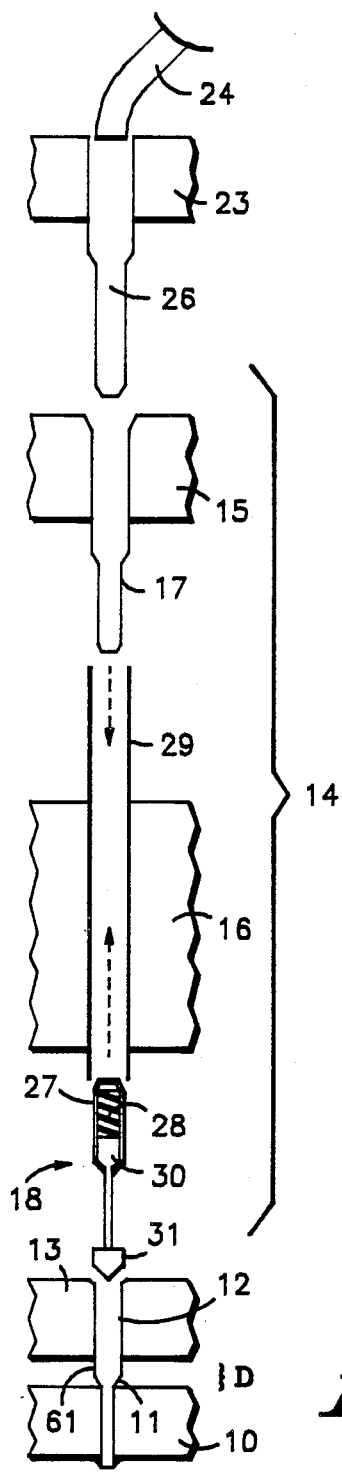
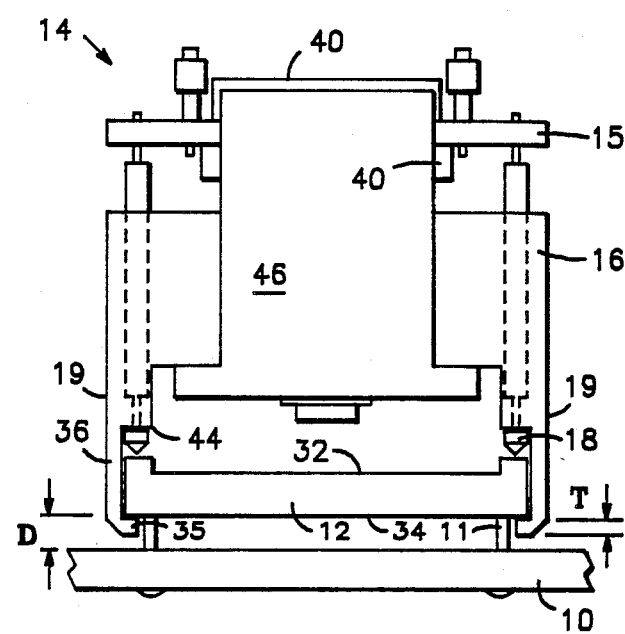
FIG. 2
FIG. 4

ELECTRICAL CIRCUIT TESTING APPARATUS

STATEMENT OF GOVERNMENT INTEREST

The Government has rights in this invention pursuant to contract No. MDA 904-83-C-0483 awarded by the National Security Agency.

BACKGROUND OF THE INVENTION

This invention relates generally to connectors. Specifically, the present invention relates to connectors which may be useful in the testing of electronic circuits. More specifically, the present invention relates to a plug type of connector which mates with a conventional integrated circuit socket.

In testing electronic circuits, an integrated circuit (IC), such as a microprocessor or read only memory (ROM), may be removed from its IC socket. A plug connector, which electrically interfaces to test equipment, such as a microprocessor emulator or ROM simulator, then replaces the removed IC in the IC socket. In a production testing environment this plug connector must be inserted and removed from IC sockets many times every hour. Thus, a thin coating of highly conductive metal on the plug connector's pins tends to rapidly wear out. Additionally, the plug connector pins often risk bending. Accordingly, a need exists in the art for a plug connector which does not rapidly wear out or easily suffer from bent pins and yet easily connects and disconnects with an IC socket.

Extension sockets have been used as one answer to this need. An extension socket contains pins which plug into the IC socket and sockets into which are plugged pins of the test equipment plug connector. The extension socket protects the test equipment plug connector from experiencing the high frequency of insertion and removal described above. However, the pins of the extension socket now experience this high frequency. Thus, the pins of the extension socket may rapidly wear out or easily bend. Therefore, extension sockets are often replaced. This involves a considerable expense of money and time and requires an on-hand supply of such extension sockets. Additionally, no quick connection and disconnection scheme is provided and an excessive amount of time may be consumed in inserting and removing the extension sockets from IC sockets.

Spring probes, also called spring contact probes, compliant spring probes, and pogo-pins, are used in testing electrical circuits and may be used in probing connector sockets. These spring probes may be relatively rigid and resistant to bending. The spring probe is not actually inserted into a mating socket, and thus does not experience the wear problem of normal connector pins. Rather, spring probes make electrical contacts by being clamped to opposing contact points of the mating socket.

In order for spring probes to effectively make a contact they must be retained and secured in proximity to the mating contact points. Various vacuum means, pressure plates, wedge plates, and specifically designed connector sockets having lugs and finger grips have been used to retain and secure spring probes in contact with opposing contact points. However, an IC socket typically is not equipped with any of these elements since it relies on friction to retain and secure an IC within the socket.

SUMMARY OF THE INVENTION

Accordingly, it is an object of the present invention to provide an improved plug connector which uses spring probes for pins and mates with conventional IC sockets without relying on an IC socket that has lugs or finger grips to secure the plug connector to the IC socket.

Another object of the present invention concerns providing a improved spring probe connector plug which may be held in contact with a mating IC socket by a member which grips the IC socket between the IC socket and a printed wiring board.

The above and other objects and advantages of the present invention are carried out in one form by an apparatus having a non-conductive base and a plurality of spring probes projecting perpendicularly away from a mating face thereof. The spring probes are spaced apart within the base to permit mating with a corresponding integrated circuit socket. Two J-shaped members are positioned on opposing sides of the base and project perpendicularly away from the base. Each of the J-shaped members has a finger portion which projects toward the other of the J-shaped members. The finger portions of the J-shaped members facilitate securing the apparatus to the integrated circuit socket by engaging a mounting surface of the integrated circuit socket.

BRIEF DESCRIPTION OF THE DRAWINGS

A more complete understanding of the present invention may be derived by reference to the detailed description and claims when considered in connection with the accompanying drawings, wherein:

FIG. 2 shows an exploded cross-sectional view of devices which make a connection to a single pin of an integrated circuit socket;

FIG. 4 shows an end view of a second embodiment of the present invention positioned relative to an integrated circuit socket;

DETAILED DESCRIPTION OF THE PREFERRED EMBODIMENT

Figure 1:
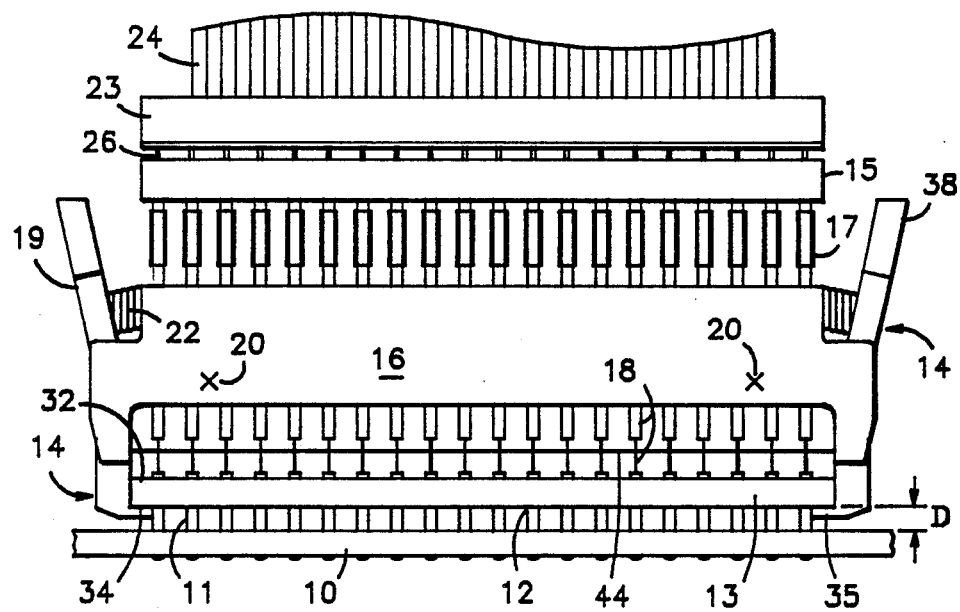
FIG. 1 shows a side view of a first embodiment of the present invention secured to an integrated circuit socket.
Figure 3:
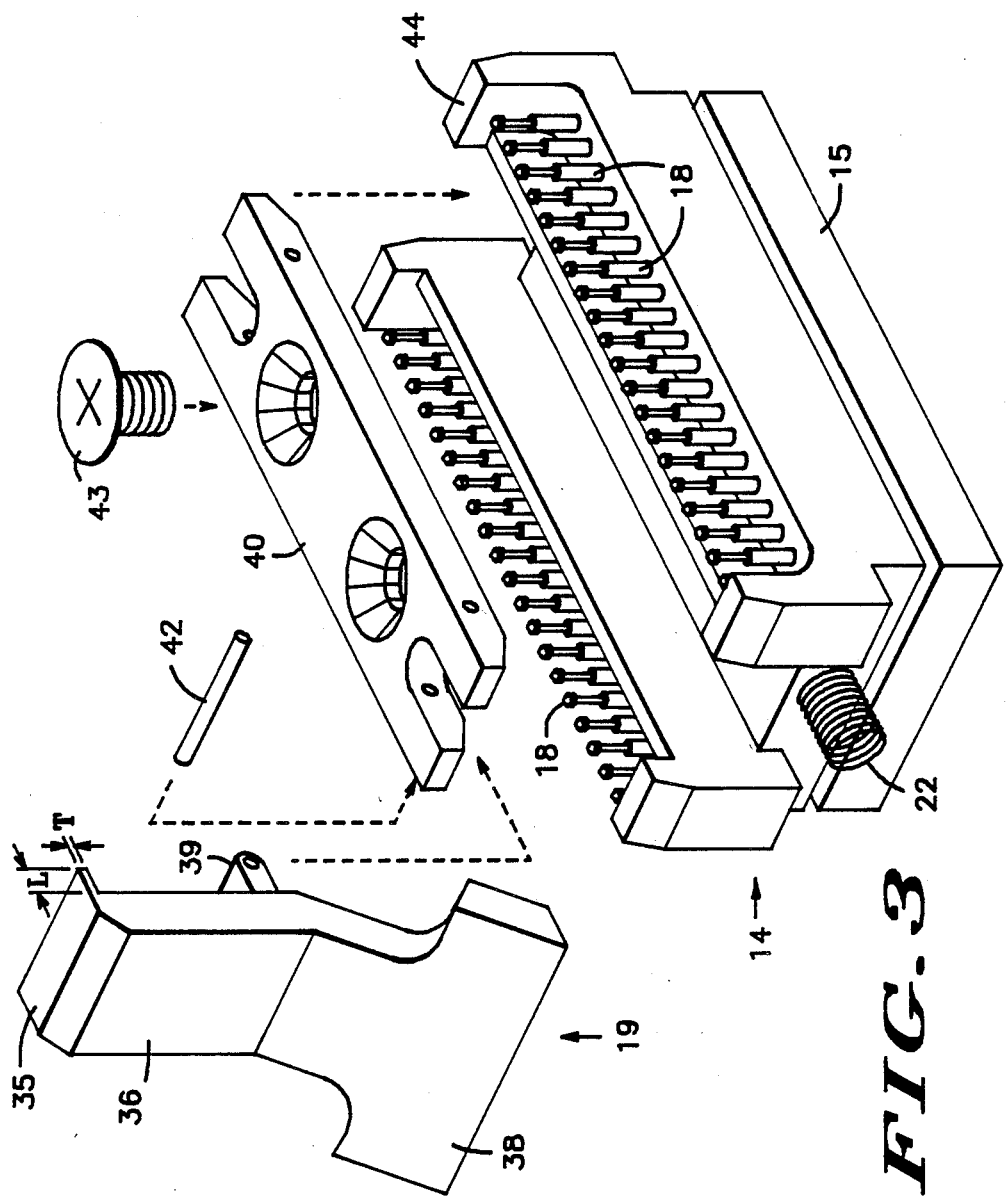
FIG. 3 shows an exploded, perspective view of the bottom side of the first embodiment.

FIGS. 1 through 3 show various views of a first embodiment of the present invention. The first embodiment represents a plug connector which mates with a conventional 48 pin dual-in-line (DIP) integrated circuit (IC) socket. The DIP IC socket contains two parallel lines of isolated socket pins. In each line the center of each socket pin resides approximately one-tenth of an inch away from the center of an adjacent socket pin.

Referring to FIG. 1, which shows a side view of the present invention, an IC socket 12 is mounted on a circuit board, such as printing wiring board (PWB) 10. IC socket 12 contains a multiplicity of socket pins 11. Each of pins 11 are soldered to PWB 10. IC socket 12 also contains an IC socket base 13 which is made of a nonconductive material which supports and defines the spacing between IC socket pins 11. A mating surface 32 of IC socket 12 opposes and is substantially parallel to a mounting surface 34 of IC socket 12. Mounting surface 34 represents the surface of IC socket 12 which faces PWB 10 when IC socket 12 is mounted on PWB 10, as shown in FIG. 1.

An apparatus 14 represents a plug connector which mates with IC socket 12. Apparatus 14 contains a multiplicity of spring probes 18 which, when mated with IC socket 12, contact socket pins 11. Spring probes 18 are secured at one end thereof within a spacer 16 and project perpendicularly away from spacer 16 at a mating face 44 of spacer 16. Spacer 16 is constructed from a relatively rigid nonconductive material, such as Delrin ® manufactured by DuPont. Spacer 16 holds spring probes 18 spaced apart from each other and in a spacial relationship which permits mating with IC socket 12 so that each of IC pins 11 contacts one and only one of probes 18.

When apparatus 14 mates with IC socket 12, spacer 16 resides between IC socket 12 and a header 15 portion of apparatus 14. An IC socket similar to IC socket 12 may be used for header 15. Header 15 contains a plurality of header pins 17 which are adapted to make an electrical connection to spring probes 18.

Header 15 serves as an IC socket which mates with an IC connector plug 23. Connector plug 23 in-turn makes electrical connections to a ribbon cable 24. Ribbon cable 24 may be connected to various electrical test equipment such as PROM simulators or microprocessor emulators (not shown). Thus, the test equipment can be electrically connected to circuits contained on PWB 10 through ribbon cable 24, IC connector plug 23, header 15 and header pins 17, spring probes 18 and IC socket 12.

Referring to FIG. 2, an exploded cross-sectional view of a single electrical connection is shown. A single wire within ribbon cable 24 connects to a ribbon plug pin 26 within IC connector plug 23. Ribbon plug pin 26 mates with header pin 17 of header 15. Header pin 17 in the present embodiment is permanently secured within one end of a spring probe receptacle 29 by soldering. Spacer 16 supports spring probe receptacle 29. Spring probe 18 inserts into the other end of receptacle 29 and is retained within receptacle 29 by frictional force between spring probe 18 and the interior surface of spring probe receptacle 29. As shown in FIG. 2, spring probe 18 contains a spring probe contact 31 which can be brought into physical contact with IC socket pin 11. IC socket pin 11 makes an electrical contact with a trace (not shown) on PWB 10 by being soldered to the trace.

Spring probe 18 contains a hollow spring probe cylinder 27. The interior of spring probe cylinder 27 contains a spring probe spring 28, and the exterior of spring probe cylinder 27 makes contact with spring probe receptacle 29. Spring probe 18 also contains a spring probe plunger 30 which extends from within spring probe cylinder 27 on one end, through an opening in spring probe cylinder 27, to spring probe contact 31 on the other end. Spring 28 urges plunger 30 and contact 31 to a fully extended position where contact 31 is at a maximum distance away from spring probe cylinder 27. However, by application of a force on contact 31 in the direction of spring probe cylinder 27, contact 31 may move in the direction of spring probe cylinder 27 while cylinder 27 remains stationary.

The present invention insures that a good electrical contact is maintained between spring probe 18 and IC socket pin 11. A low resistance contact which is not easily disturbed regardless of environmental conditions, orientations, or bumping, represents a good electrical contact. The present invention maintains this good electrical contact by causing contact 31 to physically touch and exhibit a predetermined force against IC socket pin 11. The exertion of the predetermined force is important in insuring that the electrical connection between spring probe 18 and IC socket pin 11 is a good electrical contact. However, this predetermined force must not be so great as to damage IC socket 12 or spring probe 18. Thus, spring probe spring 28 allows spring probe plunger 30 and spring probe contact 31 to travel toward spring probe cylinder 28 while exerting an effective force between contact 31 and IC socket pin 11.

Spring probes 18 must be securely retained in a position near IC socket pin 11 so that spring probe plunger 30 and spring probe contact 31 are displaced from the fully extended position towards spring probe cylinder 27. The present invention provides a structure for securely retaining spring probes 18 in such position through the use of J-shaped members 19, as shown in FIGS. 1 and 3.

Referring to FIGS. 1 and 3, for this embodiment of the present invention each of the J-shaped members 19 attach to spacer 16 at pivot points 20. Thus, J-shaped members 19 are hinged to spacer 16 and can be rotated about pivot points 20.

In the present invention header 13 of IC socket 12 is displaced from PWB 10 by a predetermined distance D. Distance D may be easily maintained between most conventional IC sockets 12 and printed wiring boards 10 because most conventional IC socket pins 11 contain a relatively wide collar portion 61 (See FIG. 2) which projects beyond base 13 of IC socket 12. Collar portion 61 is too wide to be inserted into a printed wiring board 10, so distance D may be easily maintained between base 13 and printed wiring board 10. Of course, those skilled in the art will recognize that even if an IC socket 12 does not contain a collar portion 61 which projects beyond base 13, the distance D may be established by soldering IC socket pins 11 to PWB 10 so that base 13 does not contact PWB 10.

Referring to FIGS. 1 and 3, J-shaped members 19 contain a finger portion 35 of a thickness T and length L. The thickness T must be less than distance D described above. In the present embodiment, the thicknes T is approximately 0.030 inch, and the length L is approximately 0.100 inch. Each of J-shaped members 19 also contain an arm portion 36 from which finger portion 35 perpendicularly projects, a pivot beam 39 which also projects perpendicularly from arm 36 in the same direction as finger 35, and a handle portion 38 which connects on one end to an end of arm 36 at an obtuse angle. Resilient elements, such as springs 22, are inserted between handles 38 and spacer 16 to urge handles 38 outward from spacer 16. When handles 38 are fully extended outward from spacer 16, J-shaped members 19 are in a normal position where fingers 35 are positioned toward the interior of apparatus 14. However, J-shaped members 19 may be placed in a mounting position by moving handles 19 against the action of springs 22 toward spacer 16.

To install apparatus 14, handles 38 of J-shaped members 19 are each depressed inward toward spacer 16. This action causes J-shaped members 19 to pivot so that fingers 35 of J-shaped members 19 travel toward the outside of spacer 16. When handles 38 are fully depressed inward apparatus 14 may be positioned relative to IC socket 12 so that spring probes 18 physically contact corresponding IC socket pins 11. Then, by pressing apparatus 14 toward PWB 10 all of springs 28 (see FIG. 2) compress and apparatus 14 moves in the direction of PWB 10. This movement also causes fingers 35 of J-shaped members 19 to move in the direction of PWB 10. Eventually, apparatus 14 moves toward PWB 10, so that inward movement of fingers 35 will not be blocked by base 13 of IC socket 12. Now, fingers 35 are free to move inward towards the central area of IC socket 12. Springs 22 exert an outward force on handles 38 of J-shaped members 19 tending to cause J-shaped members 19 to pivot about pivot points 20. Thus, fingers 35 of J-shaped members 19 tend to travel inward toward the central area of IC socket 12. The force which presses apparatus 14 toward printed wiring board 10 can now be removed. The collective action of springs 28 within spring probes 18 may cause apparatus 14 to move away from printed wiring board 10 a small distance until fingers 35 of J-shaped members 19 engage mounting surface 34 of IC socket 12.

At this point apparatus 14 is securely retained relative to IC socket 12. J-shaped members 19 and fingers 35 releasably attach spring probes 18 to IC socket pins 11. Good electrical connections are maintained between spring probes 18 and IC socket pins 11 by the forces exerted from springs 28 within spring probes 18. On one end of springs 28 forces are exerted on plungers 30 which urge contacts 31 toward PWB 10. At the other end of springs 28 forces are exerted through spacer 16, and J-shaped members 19, to fingers 35 and IC socket 12, urging IC socket 12 towards spacer 16.

Referring to FIG. 3, an exploded perspective view from the mating face 44 side of spacer 16 is shown. A reinforcement bar 40 constructed from a rigid material, such as aluminum, is installed in spacer 16. Reinforcement bar 40 prevents spacer 16 from distorting under the pressure exerted by spring probes 18 and thus helps maintain a good electrical connection for each of spring probes 18. Reinforcement bar 40 may be attached to spacer 16 using a screw 43.

Additionally, reinforcement bar 40 establishes pivot points 20 (see FIG. 1). Reinforcement bar 40 contains grooves in opposing ends thereof which accommodate pivot beams 39 of J-shaped members 19. Pivot pins 42 are inserted into holes through reinforcement bar 40 which traverse the above mentioned grooves. Pivot beams 39 provide corresponding holes which accommodate pivot pins 42. Thus, when pivot pins 42 are inserted in reinforcement bar 40 and through pivot beams 39, pivot points 20 are established about which J-shaped members 19 rotate.

In the present invention pivot points 20 are displaced toward the interior of reinforcement bar 40 from arms 36 of J-shaped members 19. When apparatus 14 is securely mounted to IC socket 12, pivot points 20 are displaced further towards the center of spacer 16 than the length L which defines the ends of fingers 35. This displacement of pivot points 20 helps J-shaped members 19 remain in the normal position in spite of external forces applied to apparatus 14. However, apparatus 14 may be removed by using the provided method of pressing handles 38 toward the center of spacer 16.

Figure 6:
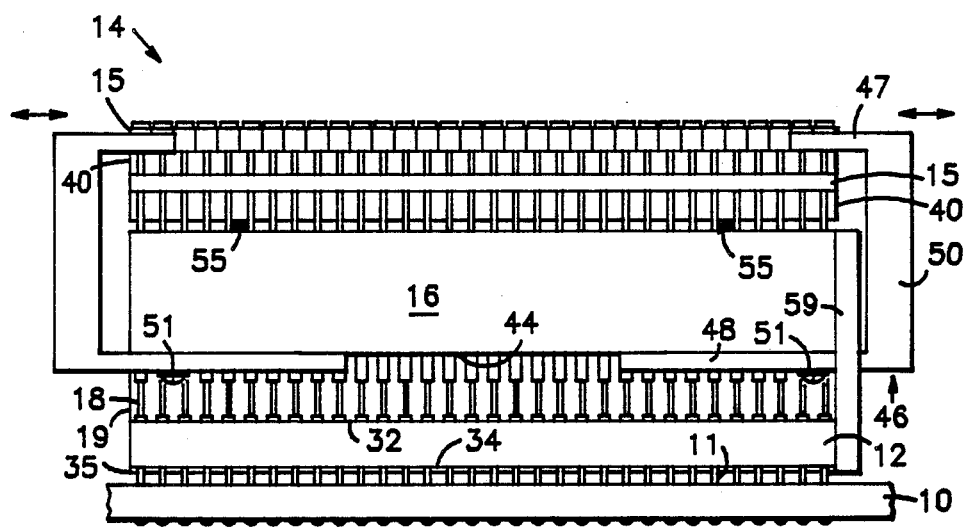
FIG. 6 shows a side view of the second embodiment of the present invention secured to an integrated circuit socket.
Figure 5:
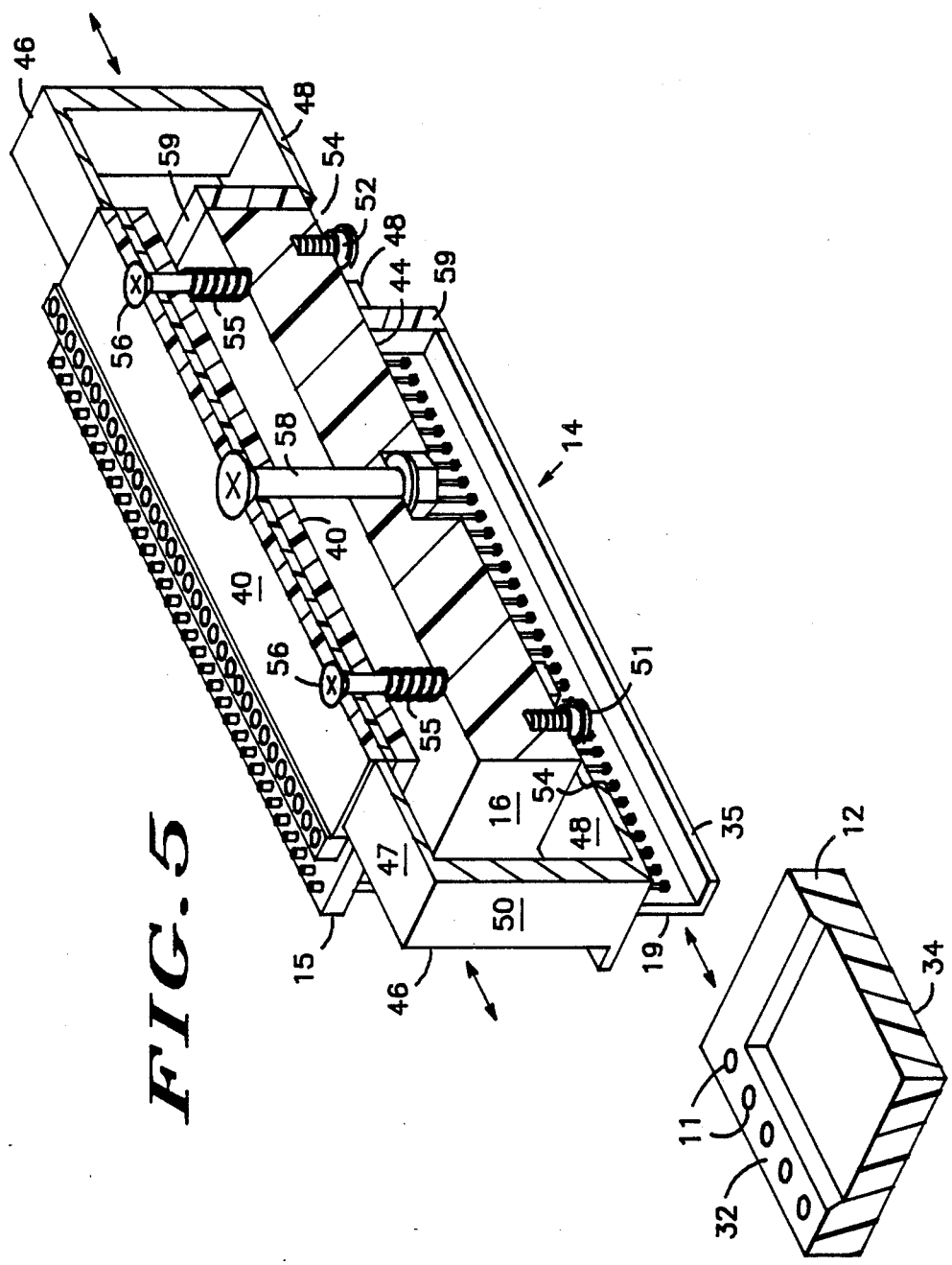
FIG. 5 shows a perspective cross-sectional view of the second embodiment.

FIGS. 4 through 6 show differing views of a second embodiment of the present invention. Although the first embodiment described above may be adapted for use with any number of socket types, the second embodiment may be particularly advantageous when the present invention mates with IC sockets having a relatively large number of socket pins. A large number of socket pins requires a large number of spring probes for mating therewith. The greater the number of spring probes, the greater amount of force that is required to depress all of the spring probes. Thus, when greater amounts of force are required to install apparatus 14 the second embodiment may be easier to install than the first.

FIG. 4 shows an end view of the second embodiment of the present invention. Apparatus 14 is in an installation position relative to IC socket 12.

IC socket 12 contains IC socket base 13 and IC socket pins 11. IC socket pins 11 project away from IC socket base 13 at IC socket mounting surface 34. Additionally, IC socket pins 11 are attached to PWB 10 so that IC socket base 13 is positioned a distance D away from printed wiring board 10, as discussed above in connection with the first embodiment.

In the first embodiment J-shaped members 19 are pivotable members which perform the dual functions of grasping IC socket 12 and fastening apparatus 14 to IC socket 12. The second embodiment differs from the first embodiment in that J-shaped members 19 are combined with spacer 16 into an integral unit. In this second embodiment J-shaped members 19 do not pivot. Rather, J-shaped members 19 only grasp IC socket 12. A fastening function is performed in the second embodiment by a U-shaped member 46 which slideably attaches to spacer 16.

In the second embodiment J-shaped members 19 contain J-shaped member arms 36 which extend perpendicular to PWB 10 beside IC socket 12. J-shaped member fingers 35 are located at one end of J-shaped member arms 36 and extend parallel to PWB 10 in a direction which points toward the interior of apparatus 14. In the second embodiment, fingers 35 engage the mounting surface 34 of IC socket 12 along lines substantially parallel to lines formed by IC socket pins 11.

Although FIG. 4 shows apparatus 14 in an installation position relative to IC socket 12, it shows apparatus 14 as not actually being installed. Thus, spring probes 18 are shown projecting from mating surface 44 of spacer 16 but not yet contacting IC socket 12. Spring probes 18 rigidly attach to header 15 but not to spacer 16. Spring probes 18 are contained with openings through spacer 16 and are free to move within spacer 16 along the axial dimension of spring probes 18.

Apparatus 14 may be installed with IC socket 12 by depressing header 15 toward PWB 10 so that spring probes 18 contact IC socket pins 11 in a manner similar to that discussed above in connection with the first embodiment. U-shaped members 46 may then fasten or lock header 15 at a predetermined distance away from spacer 16. A force, which clamps apparatus 14 to IC socket 12, is collectively exerted from spring probes 18 to header 15, through U-shaped members 46 to spacer 16 and fingers 35 of J-shaped members 19. Reinforcing bars 40 are included to prevent distortion of header 15 from the pressure exerted by springs 28 (see FIG. 2) of spring probes 18.

FIG. 5 depicts a cross-sectional perspective view of the second embodiment of apparatus 14. In FIG. 5 a portion of IC socket 12 is shown with mating surface 32 facing the header 15 portion of apparatus 14 and mounting surface 34 facing the J-shaped member finger portion 35 of apparatus 14. Apparatus 14 may be positioned for installation to IC socket 12 by placing fingers 35 in a plane substantially defined by mounting surface 34 of IC socket 12. Apparatus 14 may then slide over IC socket 12 until IC socket 12 abuts a backstop 59 portion of apparatus 14. At this point IC socket 12 is positioned relative to apparatus 14 so that spring probes 18 directly oppose corresponding IC socket pins 11.

In order to permit apparatus 14 to slide over IC socket 12, resilient elements, such as springs 55, urge header 15 and therefore spring probes 18 away from fingers 35. Thus, spring probes 18 do not interfere with the sliding of apparatus 14 over IC socket 12. Screw 58 secures header 15 and reinforcing bars 40 to spacer 16. Additionally, screw 58 limits the travel of header 15 away from fingers 35.

After apparatus 14 slides over IC socket 12 it may be installed to IC socket 12. As discussed above, the installation occurs by depressing header 15 toward spacer 16 and using U-shaped members 46 to fasten header 15 in a predetermined spaced apart relationship with spacer 16.

Each of U-shaped members 46 contain a short leg 47 substantially parallel to a long leg 48. Short leg 47 and long leg 48 are spaced apart from each other by a connection leg 50. Long leg 48 slideably attaches to spacer 16 at a screw 51. A bushing 52 is provided so that U-shaped members 46 may freely slide relative to spacer 16 without binding at screw 51. A U-shaped member slot 54 is provided within long leg 48 of U-shaped member 46. Bushing 52 installs in slot 54. Screw 51 inserts through bushing 52 and is screwed into spacer 16. Thus, after header 15 has been depressed toward spacer 16 as described above, U-shaped members 46 are free to slide along an imaginary line (not shown) defined by screws 51. When U-shaped members 46 are moved outward from apparatus 14 along this imaginary line, header 15 may be moved toward or away from spacer 16. However, after U-shaped members 46 have been moved inward along this imaginary line, header 15 becomes fastened in place relative to spacer 16 and cannot move away from spacer 16 because short legs 47 block such movement.

FIG. 6 shows a side view of apparatus 14 installed with and secured to IC socket 12. Spring probes 18 contact IC socket pins 11 of IC socket 12. A constant force is exerted on each of IC socket pins 11 from individual ones of springs 28 (see FIG. 2) which are contained within spring probes 18. First ends of springs 28 directly operate on plungers 30 and contacts 31 of spring probes 18 (see FIG. 2). Second ends of springs 28 supply a collective force to header 15 which urges header 15 away from PWB 10. This force is transmitted to short legs 47 of U-shaped members 46, connection legs 50 and long legs 48 of U-shaped members 46, and to spacer 16. In the second embodiment J-shaped members 19 and fingers 35 are integral portions of spacer 16. Thus, this force is applied to mounting surface 34 of IC socket 12 from fingers 35. Resultingly, apparatus 14 is clamped to IC socket 12 and a good electrical connection is maintained at all IC socket pins 11.

The foregoing description uses various embodiments to illustrate the present invention. However, those skilled in the art will recognize that changes and modifications may be made in these embodiments without departing from the scope of the present invention. For example, other fastening mechanisms may be used. The J-shaped members of the first embodiment may slide rather than pivot. Or, alternate fastening techniques to the U-shaped members of the second embodiment may be used. Additionally, a circuit board to which IC sockets may be attached is not limited to being a PWB as described herein. Furthermore, various types of spring probes are available and may be successfully adapted for use in the present invention. These and other modifications obvious to those skilled in the art are intended to be included within the scope of this invention.

What is claimed is:

1. An electrical circuit testing apparatus for mating with an integrated circuit socket having a mating surface substantially parallel to a mounting surface, said apparatus comprising:
   a nonconductive base having a mating face, and further comprising a header and a spacer wherein said header is movable relative to said spacer;
   first and second J-shaped members positioned on opposing sides of said base and projecting away from said base substantially perpendicular to the mating face of said base, wherein each of said J-shaped members has a finger portion projecting toward the other of said J-shaped members, and said J-shaped members and finger portions thereof are formed together with said spacer into an integral unit, said finger portions being for engaging the mounting surface of the integrated circuit socket;
   a plurality of spring probes connected to said base in a spaced apart relationship and projecting away from said base substantially perpendicular to the mating face of said base, said spring probes being for contacting the mating surface of the integrated circuit socket, wherein said spring probes are rigidly attached to said header and comprise a contact portion and a cylinder portion, said contact portion being axially movable with respect to said cylinder portion, and said cylinder portion being positioned substantially within holes in said spacer and axially moveable relative to said spacer; and
   the apparatus additionally comprises a fastener slideably affixed one of said spacer and said header for releasably securing said header at a predetermined position relative to said spacer.

2. An apparatus as claimed in claim 1 wherein said fastener comprises first and second U-shaped members each having a short leg substantially parallel to a long leg.

3. An apparatus as claimed in claim 1 additionally comprising a reinforcing bar attached to said header to prevent distortion of said header from pressure exerted by said spring probes.

4. An apparatus as claimed in claim 1 additionally comprising a spring mounted between said header and spacer, said spring being mounted so that said header and said spacer are urged apart.

5. A method of making electrical connections with an integrated circuit socket, the method comprising the steps of:
   arranging a plurality of spring probes to project away from a nonconductive base;
   permitting a header portion of the base to move relative to a spacer portion of the base;
   rigidly attaching the spring probes of said arranging step to the header portion of the base of said permitting step;
   allowing axial movement of the spring probes within the spacer portion of the base of said permitting step;
   attaching the integrated circuit socket to a circuit board so that the integrated circuit socket is spaced apart from the circuit board by a predetermined distance;

grasping the integrated circuit socket by J-shaped members having fingers, the fingers being thinner than the predetermined distance of said attaching step and located on opposing sides of the base;

integrally forming the J-shaped members of said grasping step as part of the spacer; and slideably attaching a fastener to one of the header and spacer portions of the base.

6. A method as claimed in claim 5 additionally comprising the step of urging the header portion of the base away from the spacer portion of the base by action of a resilient element.

7. An electrical circuit testing apparatus for mating with an integrated circuit socket having a multiplicity of pins arranged in parallel lines and a mating surface substantially parallel to a mounting surface, said apparatus comprising:

a nonconductive base having a header which is movable relative to a spacer, the spacer having a mating face;

a multiplicity of spring probes arranged in parallel lines wherein each of said spring probes has a cylinder portion rigidly affixed to the header of said base, positioned substantially within a hole in the spacer of said base, and is axially movable relative to the spacer, and wherein each of said spring probes has a contact portion projecting away from said base substantially perpendicular to the mating face of the spacer, the contact portion being movable relative to the cylinder portion and being for contacting the integrated circuit socket pins at the mating surface of the integrated circuit socket;

first and second J-shaped members integrally formed on opposing sides of the spacer of said base substantially parallel to the lines of said spring probes wherein each of said J-shaped members has a finger portion projecting toward the other of said J-shaped members, the finger portions being for engaging the mounting surface of the integrated circuit socket; and first and second U-shaped members wherein each of said U-shaped members has a short leg substantially parallel to a long leg, the long leg of each of said U-shaped members being slideably affixed to one of the spacer and header of said base, said U-shaped members being for releasably securing said header in a predetermined position relative to said spacer.

* * * * *